US011495579B2

(12) United States Patent
Haba et al.

(10) Patent No.: US 11,495,579 B2
(45) Date of Patent: *Nov. 8, 2022

(54) CAPACITIVE COUPLING IN A DIRECT-BONDED INTERFACE FOR MICROELECTRONIC DEVICES

(71) Applicant: Invensas LLC, San Jose, CA (US)

(72) Inventors: Belgacem Haba, Saratoga, CA (US); Arkalgud R. Sitaram, Cupertino, CA (US)

(73) Assignee: Invensas LLC, San Jose, CA (US)

(*) Notice: Subject to any disclaimer, the term of this patent is extended or adjusted under 35 U.S.C. 154(b) by 120 days.

This patent is subject to a terminal disclaimer.

(21) Appl. No.: 17/074,401

(22) Filed: Oct. 19, 2020

(65) Prior Publication Data
US 2021/0035954 A1 Feb. 4, 2021

Related U.S. Application Data

(60) Continuation of application No. 16/212,248, filed on Dec. 6, 2018, now Pat. No. 10,811,388, which is a
(Continued)

(51) Int. Cl.
H01L 25/065 (2006.01)
H01L 25/00 (2006.01)
(Continued)

(52) U.S. Cl.
CPC ...... H01L 25/0657 (2013.01); H01L 21/0228 (2013.01); H01L 21/02164 (2013.01);
(Continued)

(58) Field of Classification Search
CPC . H01L 25/043; H01L 25/0657; H01L 25/074; H01L 25/0756; H01L 25/117
See application file for complete search history.

(56) References Cited

U.S. PATENT DOCUMENTS 5,786,979 A 7/1998 Douglass
7,335,995 B2 2/2008 Pflughaupt et al.
(Continued)

FOREIGN PATENT DOCUMENTS

KR 1020080046020 A 5/2008
WO WO1997-24740 A1 7/1997
(Continued)

OTHER PUBLICATIONS

EP Search Report, dated Jun. 3, 2019, in Application No. 16852270.4, filed Aug. 26, 2016, 11 pages.
(Continued)

Primary Examiner — Dale E Page
Assistant Examiner — Wilner Jean Baptiste
(74) Attorney, Agent, or Firm — Haley Guiliano LLP

(57) ABSTRACT

Capacitive couplings in a direct-bonded interface for microelectronic devices are provided. In an implementation, a microelectronic device includes a first die and a second die direct-bonded together at a bonding interface, a conductive interconnect between the first die and the second die formed at the bonding interface by a metal-to-metal direct bond, and a capacitive interconnect between the first die and the second die formed at the bonding interface. A direct bonding process creates a direct bond between dielectric surfaces of two dies, a direct bond between respective conductive interconnects of the two dies, and a capacitive coupling between the two dies at the bonding interface. In an implementation, a capacitive coupling of each signal line at the bonding interface comprises a dielectric material forming a capacitor at the bonding interface for each signal line. The capacitive couplings result from the same direct bonding process that creates the conductive interconnects direct-bonded together at the same bonding interface.

12 Claims, 11 Drawing Sheets

Related U.S. Application Data continuation-in-part of application No. 16/020,654, filed on Jun. 27, 2018, now Pat. No. 10,600,760, which is a division of application No. 15/247,705, filed on Aug. 25, 2016, now Pat. No. 10,032,751.

(60) Provisional application No. 62/234,022, filed on Sep. 28, 2015.

(51) Int. Cl.

| | | |
|---|---|---|
| *H01L 23/00* | (2006.01) | |
| *H01L 21/311* | (2006.01) | |
| *H01L 21/02* | (2006.01) | |
| *H01L 23/64* | (2006.01) | |

(52) U.S. Cl.
CPC .. *H01L 21/02181* (2013.01); *H01L 21/31111* (2013.01); *H01L 23/642* (2013.01); *H01L 24/27* (2013.01); *H01L 24/32* (2013.01); *H01L 24/83* (2013.01); *H01L 25/50* (2013.01); *H01L 2224/08121* (2013.01); *H01L 2224/08145* (2013.01); *H01L 2224/27452* (2013.01); *H01L 2224/27614* (2013.01); *H01L 2224/29187* (2013.01); *H01L 2224/32135* (2013.01); *H01L 2224/80* (2013.01); *H01L 2224/80895* (2013.01); *H01L 2224/80896* (2013.01); *H01L 2224/83896* (2013.01); *H01L 2225/06531* (2013.01); *H01L 2924/01072* (2013.01); *H01L 2924/0534* (2013.01); *H01L 2924/05442* (2013.01); *H01L 2924/14* (2013.01); *H01L 2924/30105* (2013.01)

(56) References Cited

U.S. PATENT DOCUMENTS

| | | | |
|---|---|---|---|
| 7,462,935 B2 | 12/2008 | Neaves | |
| 7,535,105 B2 | 5/2009 | Voldman | |
| 7,596,842 B2 * | 10/2009 | Andresakis | H01G 4/30 |
| | | | 428/626 |
| 8,310,061 B2 | 11/2012 | Chandrasekaran | |
| 8,680,652 B2 | 3/2014 | Kim et al. | |
| 9,318,471 B2 | 4/2016 | Kabe et al. | |
| 10,600,760 B2 * | 3/2020 | Haba | H01L 25/0657 |
| 10,811,388 B2 * | 10/2020 | Haba | H01L 23/642 |
| 2003/0097750 A1 | 5/2003 | Okabe et al. | |
| 2006/0234405 A1 | 10/2006 | Best | |
| 2008/0116584 A1 | 5/2008 | Sitaram | |
| 2011/0198736 A1 | 8/2011 | Shero et al. | |
| 2013/0082352 A1 | 4/2013 | Kim et al. | |
| 2013/0127055 A1 | 5/2013 | Chen et al. | |
| 2014/0117546 A1 | 5/2014 | Liu et al. | |
| 2014/0174927 A1 | 6/2014 | Bashir et al. | |
| 2016/0043060 A1 | 2/2016 | Kabe et al. | |
| 2017/0092620 A1 | 3/2017 | Haba et al. | |
| 2018/0226371 A1 | 8/2018 | Enquist | |
| 2018/0240860 A1 | 8/2018 | Yang | |

FOREIGN PATENT DOCUMENTS

| | | |
|---|---|---|
| WO | WO2014-184988 A1 | 11/2014 |
| WO | WO2014184988 A1 | 11/2014 |

OTHER PUBLICATIONS

International Search Report and Written Opinion, dated Nov. 18, 2016 in PCT Application No. PCT/US2016/048889, 10 pages.

International Search Report and Written Opinion for PCT/US2019/048530, dated Dec. 16, 2019, 11 pages.

Office action for U.S. Appl. No. 16/212,248, dated Feb. 12, 2020, Haba, "Capacitive Coupling in a Direct-Bonded Interface for Microelectronic Devices", 7 pages.

* cited by examiner

CAPACITIVE COUPLING IN A DIRECT-BONDED INTERFACE FOR MICROELECTRONIC DEVICES

RELATED APPLICATIONS

This application is a continuation of and claims priority to U.S. patent application Ser. No. 16/212,248, filed Dec. 6, 2018, which is a continuation-in-part application of and claims priority to U.S. patent application Ser. No. 16/020,654 filed Jun. 27, 2018, now U.S. Pat. No. 10,600,760, issued Mar. 24, 2020, which is a divisional application of and claims priority to U.S. patent application Ser. No. 15/247,705, filed Aug. 25, 2016, now U.S. Pat. No. 10,032,751, issued Jul. 24, 2018, which claims priority to U.S. Provisional Patent Application No. 62/234,022, filed Sep. 28, 2015, all of which are incorporated herein by reference in their entirety.

BACKGROUND

Direct bonding and direct hybrid bonding can sometimes demand critical tolerances. These processes can be made more forgiving when various ways of coupling the power, ground, and signal lines at the bonding interface can be devised that allow some misalignment, for example, and less critical tolerances to provide more reliable packages at a higher bond yield.

Also, size reduction of wafer-level packages and microelectronic elements can sometimes be inhibited by the necessary inclusion of components that are difficult to miniaturize. For example, sometimes a package relies on the relatively large size of a discrete capacitor. If the package did not have to rely on the large component, the package could be made much smaller. In other instances, a certain value of capacitance is needed in an integrated circuit design and the construction process could be streamlined if the capacitor could be built into the wafer-level package design.

SUMMARY

Capacitive couplings in a direct-bonded interface for microelectronic devices are provided. In an implementation, a microelectronic device includes a first die and a second die direct-bonded together at a bonding interface, a conductive interconnect between the first die and the second die formed at the bonding interface by a metal-to-metal direct bond, and a capacitive interconnect between the first die and the second die formed at the bonding interface. A direct bonding process creates a direct bond between dielectric surfaces of two dies, a direct bond between respective conductive interconnects of the two dies, and a capacitive coupling between the two dies at the bonding interface. In an implementation, a capacitive coupling of each signal line at the bonding interface comprises a dielectric material forming a capacitor at the bonding interface for each signal line. The capacitive couplings result from the same direct bonding process that creates the conductive interconnects direct-bonded together at the same bonding interface.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DETAILED DESCRIPTION

Overview

Figure 1:
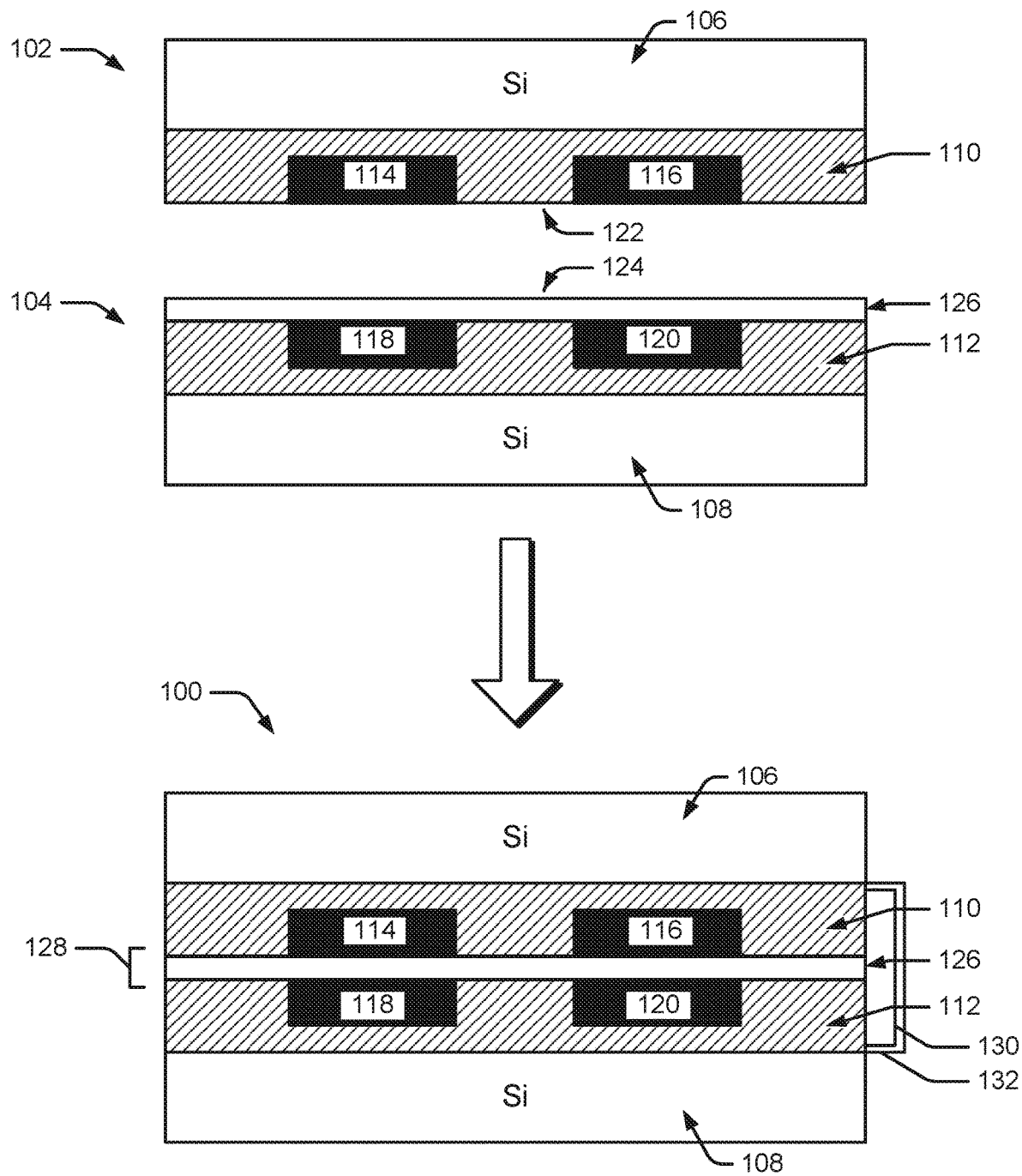
FIG. 1 is a diagram of an example wafer-level package construction 100 that includes an example capacitive coupling with an ultrathin dielectric layer.

This disclosure describes capacitive couplings in a direct-bonded interface for microelectronic devices. A direct hybrid bonding process for microelectronic dies and wafers also creates a capacitive coupling for each individual signal line at the bonding interface. In an implementation, a direct hybrid bonding process creates a direct bond between dielectric surfaces of two dies, creates a direct bond between respective power interconnects of the two dies, creates a direct bond between respective ground interconnects of the two dies, and creates a capacitive coupling for each signal line at a bonding interface of the direct hybrid bonding process.

The direct bond between the dielectric surfaces can be an oxide-to-oxide direct bond. The direct bond between the respective power interconnects is a metal-to-metal direct bond. The direct bond between the respective ground interconnects is also a metal-to-metal direct bond. The capacitive coupling of each signal line at the bonding interface comprises a dielectric material forming a capacitor at the bonding interface for each signal line, resulting from the direct hybrid bonding process.

Example techniques achieve a capacitive coupling with very fine pitch, in a package construction. A very thin dielectric layer on the order of nanometers may be achieved between two conductive areas (plates or pads, i.e., one from each die) by joining two opposing surfaces. The two plates or pads are joined together to form a capacitor with separation, for example, under 50 nanometers.

In an example implementation, each component to be coupled has a surface that includes at least one conductive area, such as a metal pad or plate (i.e., capacitor plate). An ultrathin layer of dielectric is formed on at least one surface to be coupled. When the two components are permanently contacted together, the ultrathin layer of dielectric remains between the two surfaces, forming a capacitive interface between the conductive areas of each respective component. In an implementation, the ultrathin layer of dielectric may be composed of multiple layers of various dielectrics, but the combined thickness of such multiple layers is less than or equal to approximately 50 nanometers. The capacitance per unit area of the capacitive interface formed depends on the particular dielectric constants κ of the dielectric materials employed in the ultrathin layer, on the respective thicknesses of individual dielectric layers in the ultrathin layer (if more than one dielectric layer is used), and on the overall thickness of the combined ultrathin dielectric layer.

In an implementation, electrical and grounding connections can be made at the edge of the coupled stack, i.e., around the edge of the capacitive interface. Thus, within the surface area of the capacitive interface between surfaces, in an implementation there may be no conductive connections, or very few conductive connections, that penetrate through the ultrathin layer of dielectric. If conductive connections are used within the area of the surface that has the capacitive interface, such conductive connections are placed where there are no nearby metal plates participating in the capacitive interface.

The example capacitive coupling techniques described herein provide numerous benefits, such as smaller-size wafer-level packages, savings in materials used, and potentially lower voltage requirements because of thinner dielectrics and relatively high dielectric constants κ per unit area. For certain applications, such as mobile devices that utilize small size batteries, significantly lower operating voltages may be achieved.

Example Systems

FIG. 1 shows an example wafer-level package construction 100 that includes a first integrated circuit die 102 and a second integrated circuit die 104. Each integrated circuit die 102 & 104 has a semiconductor 106 & 108, such as silicon, and an underfill layer 110 & 112 composed of insulation or dielectric (for example, silicon dioxide) securing conductive areas 114 & 116 and 118 & 120. Each integrated circuit die 102 & 104 has a respective surface 122 & 124 that includes at least one of the conductive areas 114 & 116, or 118 & 120.

An ultrathin dielectric layer 126 that has a thickness less than or equal to approximately 50 nanometers is formed on at least one of the surfaces 122 or 124 of at least one of the integrated circuit dies 102 & 104. The ultrathin dielectric layer may be a coating, film, residue, membrane, deposit, and so forth. The coupled stack 100 forms a capacitive interface 128 that includes the ultrathin dielectric layer 126, and at least one pair of the respective conductive areas, e.g., 114 & 118 or 116 & 120 of the first and second integrated circuit dies 102 & 104, on opposing sides of the ultrathin dielectric layer 126.

The thickness of the ultrathin dielectric layer 126 can be in the range of approximately 2-50 nanometers. For example, the ultrathin dielectric layer 126 can be 5-6 nanometers thick. In an implementation, the ultrathin dielectric layer 126 is less than 2 nanometers thick.

In an implementation, the ultrathin dielectric layer 126 can be composed of silicon oxide (silicon dioxide $SiO_2$). Or, the ultrathin dielectric layer 126 can be composed of a dielectric such as silicon monoxide, silicon trioxide, aluminum oxide, hafnium oxide, a high-κ ionic metal oxide, a hybrid oxygen-plasma-grown metal oxide & alkylphosphonic acid self-assembled monolayer (SAM), a polymer film, or an ionic metal oxide membrane.

For example, the ultrathin dielectric layer 126 may be an atomic layer deposition of hafnium oxide with precise control of the thickness of the ultrathin dielectric layer 126 down to 1-2 nanometers.

In another example, the ultrathin dielectric layer 126 can be a layer of a metal oxide & alkylphosphonic acid self-assembled monolayer (SAM) that has a thickness of approximately 5-6 nanometers and a capacitance per unit area of approximately 500-800 $nF/cm^2$.

In an example, the two integrated circuit dies 102 & 104 may be coupled together in a stack by mechanically securing the two integrated circuit dies 102 & 104 together at an edge of the stack 100. In another example, the ultrathin dielectric layer 126 on at least one of the surfaces 122 & 124 of at least one of the integrated circuit dies 102 & 104 may have an adhesive quality for adhering the integrated circuit dies 102 & 104 to each other.

Electrical power connections 130 and electrical grounding connections 132 between the two integrated circuit dies 102 & 104 may be located at an edge of the stack 100.

Figure 2:
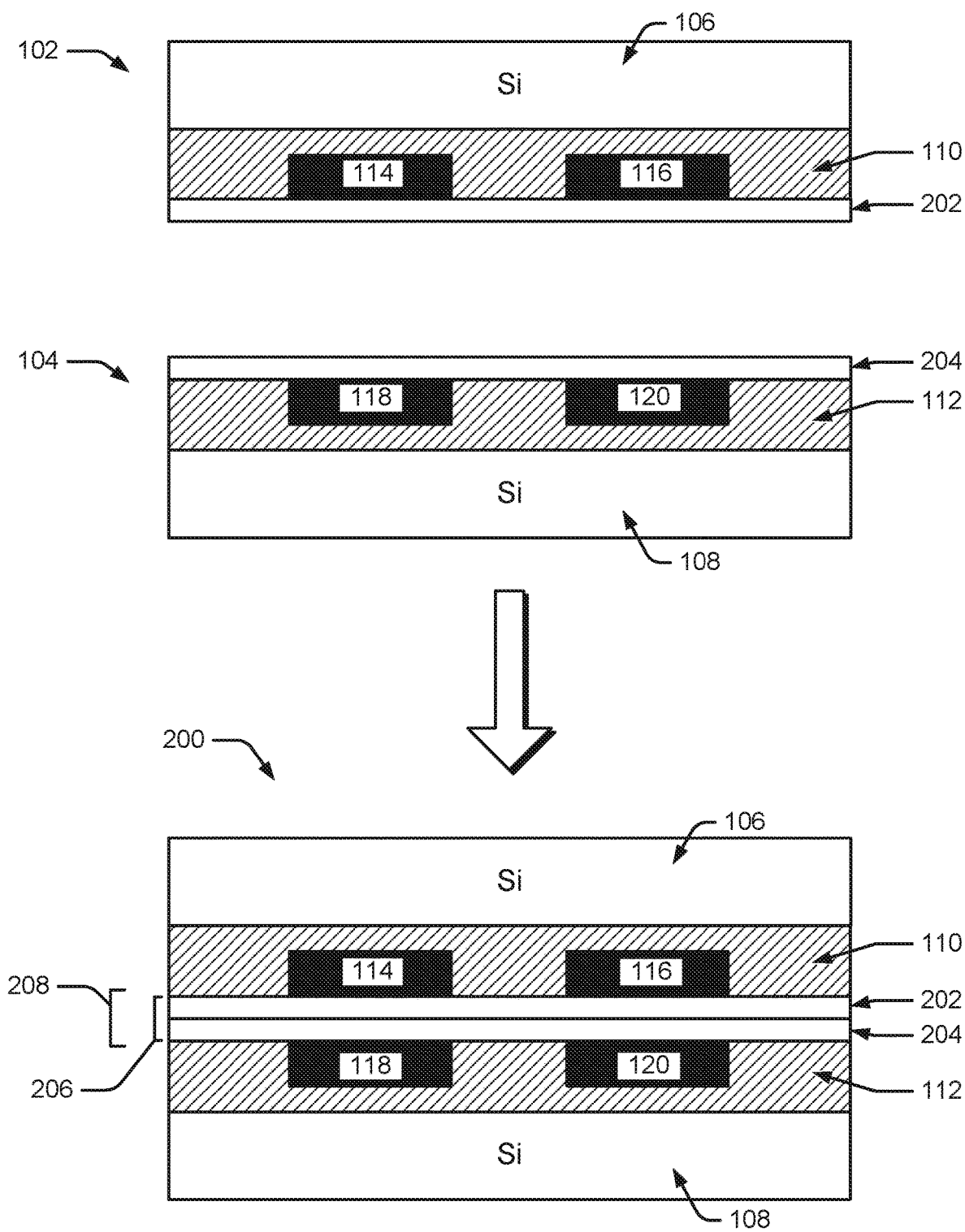
FIG. 2 is a diagram of an example wafer-level package construction in which the ultrathin dielectric layer includes two component dielectric layers.

FIG. 2 shows an example wafer-level package construction 200, in which the ultrathin dielectric layer 206 includes multiple component dielectric layers 202 & 204. In this example, a first component dielectric layer 202 is formed on one of the integrated circuit dies 102, and a second component dielectric layer 204 is formed on the other integrated circuit die 104. The multiple component dielectric layers 202 & 204 may be composed of the same dielectric material, such as silicon oxide, or different dielectric materials. In this example, each component dielectric layer 202 & 204 has a thickness of less than or equal to 25 nanometers. When the two integrated circuit dies 102 & 104 are coupled, the resulting overall ultrathin dielectric layer 206 has a thickness of less than or equal to approximately 50 nanometers. The capacitive interface 208 that is formed includes the ultrathin dielectric layer 206, and respective conductive areas 114 & 116 and 118 & 120 of the first and second integrated circuit dies 102 & 104, on opposing sides of the ultrathin dielectric layer 206.

Figure 3:
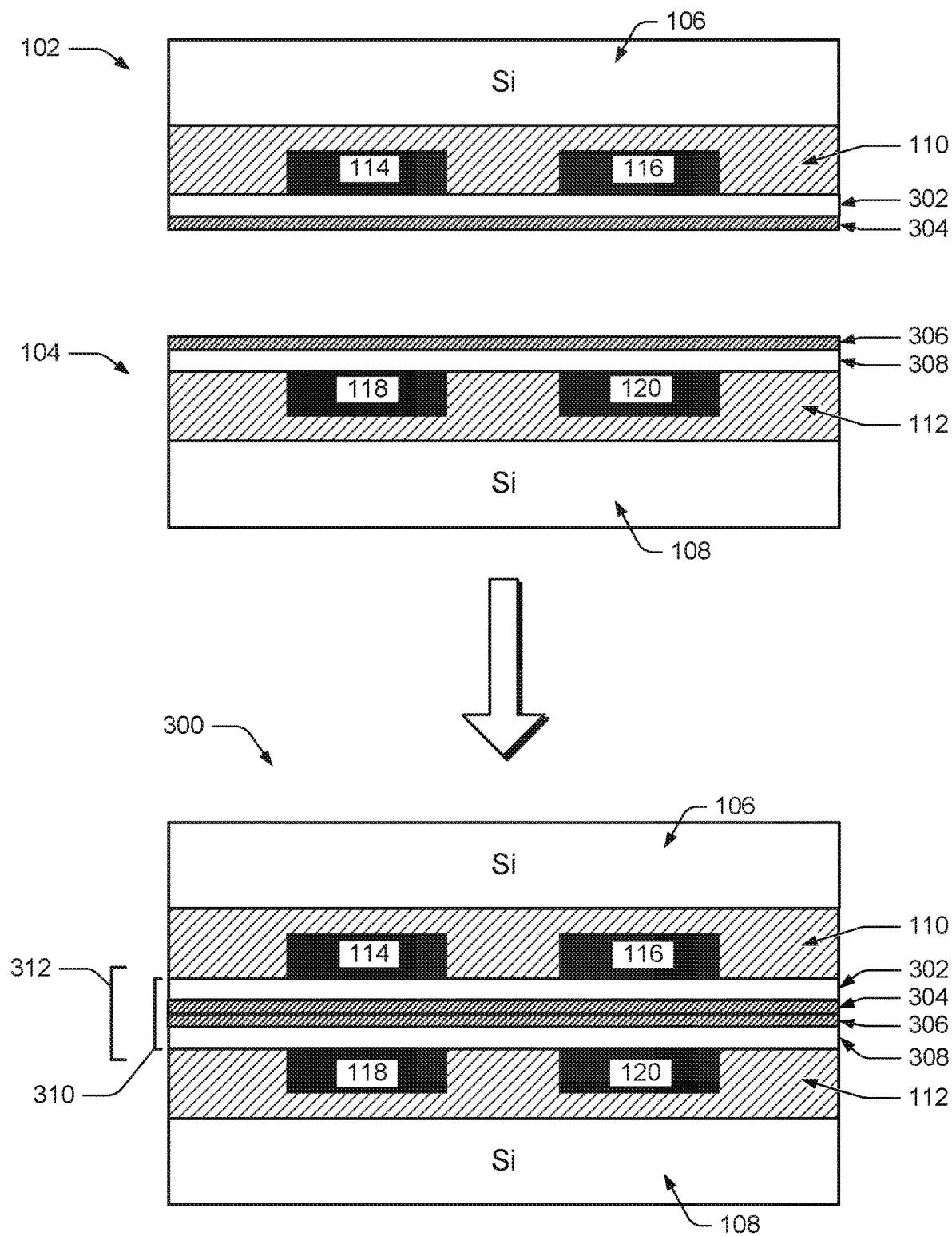
FIG. 3 is a diagram of another example wafer-level package construction in which the ultrathin dielectric layer includes multiple component dielectric layers.

FIG. 3 shows an example wafer-level package construction 300, in which the ultrathin dielectric layer 310 includes multiple component dielectric layers 302 & 304 and 306 & 308. In this example, a first set of component dielectric layers 302 & 304 is formed on one of the integrated circuit dies 102, and a second set of component dielectric layers 306 & 308 is formed on the other integrated circuit die 104. Each set of ultrathin dielectric layers 302 & 304 or 306 & 308 has a thickness of less than or equal to approximately 25 nanometers, for example. Or, when the two integrated circuit dies 102 & 104 are coupled, the resulting overall ultrathin dielectric layer 310 has a thickness of less than or equal to approximately 50 nanometers, for example. Symmetry in the thickness of the multiple layers is not needed. The capacitive interface 312 that is formed includes the ultrathin dielectric layers 302 & 304 and 306 & 308 and respective conductive areas 114 & 116 and 118 & 120 of the first and second integrated circuit dies 102 & 104, on opposing sides of the ultrathin dielectric layer 310.

When multiple layers of ultrathin dielectric materials are used for the different layers (e.g., 302 & 304 or 306 & 308) of an overall ultrathin dielectric layer 310, the multiple layers may be composed of different dielectric materials, such as one or more layers of silicon oxide, and one or more a layers of a high-κ dielectric other than silicon oxide, such as silicon monoxide, silicon trioxide, aluminum oxide, hafnium oxide, a high-κ ionic metal oxide, a hybrid oxygen-plasma-grown metal oxide & alkylphosphonic acid self-assembled monolayer (SAM), or a polymer, for example.

When multiple layers of ultrathin dielectric materials are used for the different layers (e.g., 302 & 304 or 306 & 308) of an overall ultrathin dielectric layer 310, the multiple layers may be asymmetrical with respect to a parallel central plane of the multiple layers. The asymmetry may consist of a difference in the number, arrangement, thicknesses, or composition of one or more of the multiple layers on either side of the parallel central plane of the multiple layers.

Figure 4:
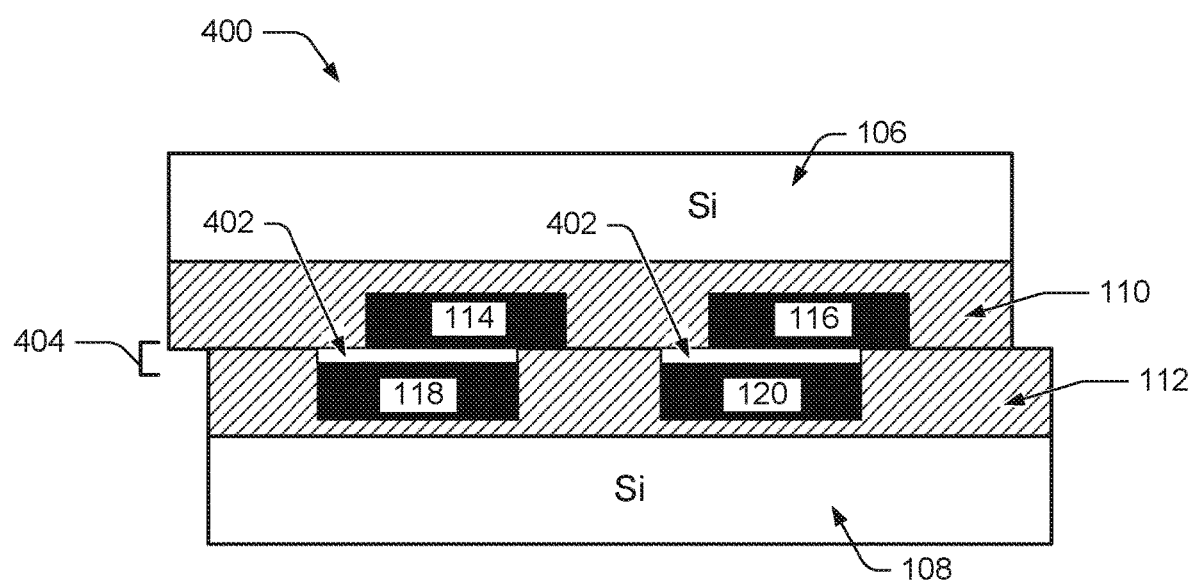
FIG. 4 is a diagram of an example wafer-level package including a capacitive interface with staggered conductive plates.

FIG. 4 shows an example embodiment of a wafer-level package 400 including a capacitive interface 404 with an ultrathin dielectric layer 402. As shown in FIG. 4, the respective conductive areas 114 & 116 and 118 & 120 of the first and second integrated circuit dies 102 & 104 do not have to align perfectly on opposing sides of the ultrathin dielectric layer 402 of the capacitive interface 404. The respective conductive areas 114 & 116 and 118 & 120 of the first and second integrated circuit dies 102 & 104 can be staggered with respect to each other, and the staggered alignment can be used to obtain a particular capacitance, for example, between a first conductive area 114 and a second conductive area 118 on opposing sides of the capacitive interface 404.

Figure 5:
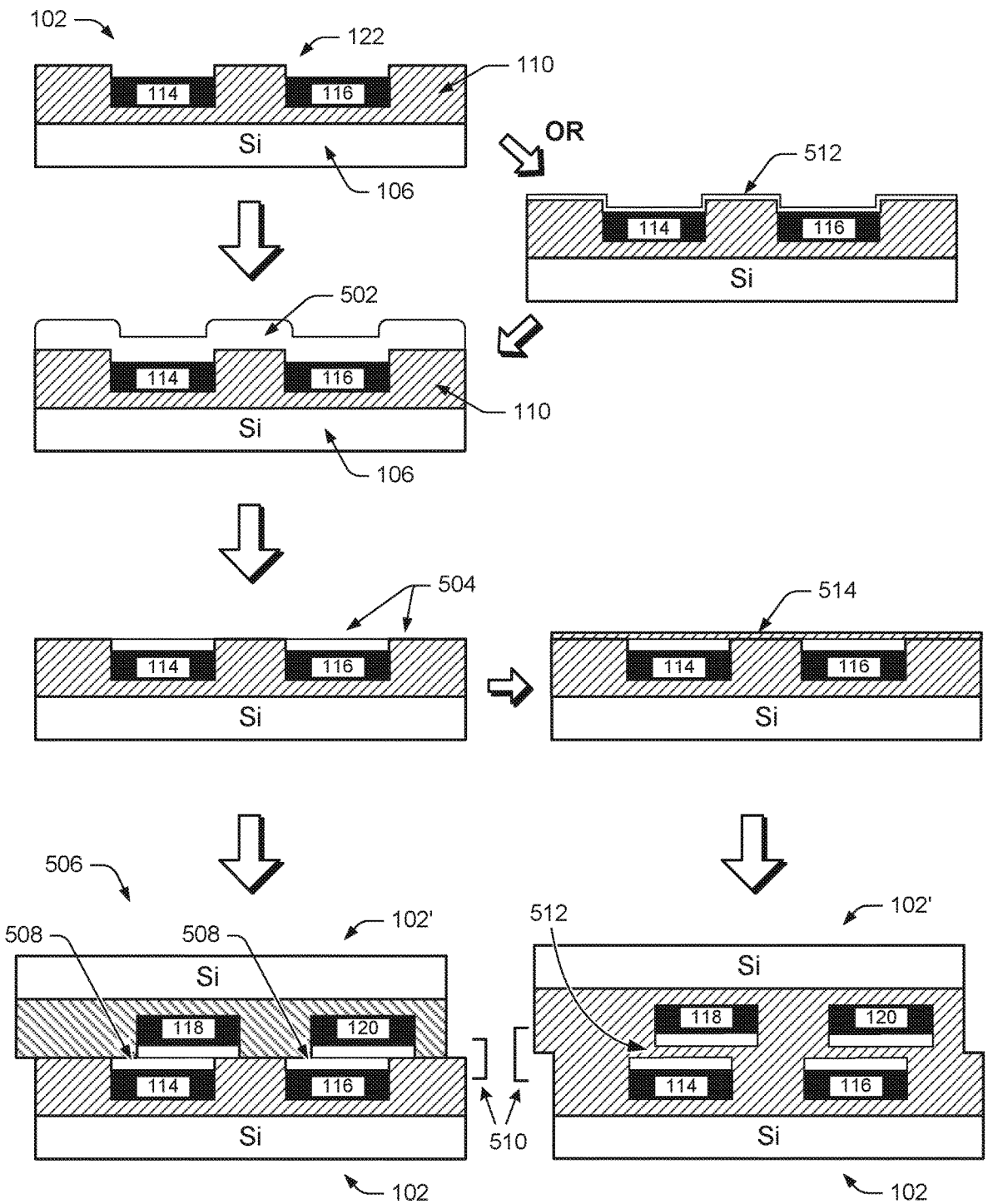
FIG. 5 is a diagram of an example process for making a coupled capacitive wafer-level package including a capacitive interface.

FIG. 5 shows an example process for making a coupled capacitive wafer-level package 500 including a capacitive interface 510. In an implementation, integrated circuit dies 102 & 102' have a semiconductor 106, such as silicon, and an underfill layer 110 composed of insulation or dielectric, such as silicon dioxide, securing one or more conductive areas 114 & 116. Each integrated circuit die 102 & 102' has a respective surface 122 that includes the conductive areas 114 & 116. The surface 122 does not have to be flat at this point in the process.

A layer of dielectric 502, such as silicon oxide or a high-κ dielectric, is formed over the surface 122, including the one or more conductive areas 114 & 116 and exposed parts of the underfill layer 110. In an implementation, the layer of dielectric 502 is ground, etched, lapped, or polished, (or deposited), etc., to a thickness less than or equal to approximately 50 nanometers. The thickness to be achieved for a given layer of the dielectric 502 may depend on how many layers are to compose the overall ultrathin dielectric layer 508, and the value of capacitance per unit area desired. The layer of dielectric 502 is etched or otherwise removed, for example, down to the exposed parts of the underfill layer 110, to form a flat surface 122.

Two instances of the same integrated circuit die 102 & 102', each now having a smooth flat surface 504, may now be coupled to form a stack 506. The capacitive interface 510 resulting from the coupling includes the ultrathin dielectric layer 508, and at least one pair of conductive areas 114 & 118 or 116 & 120, on opposing sides of the ultrathin dielectric layer 508.

In a variation, a layer of etch stop 512 or a lapping-polishing stop may be applied to the initial surface 122 to protect the underlying structures and assist formation of the ultrathin dielectric layer 508 at an ultrafine pitch. Thus, the etch stop 512 or lapping-polishing stop is deposited on the underlying structures, such as the exposed underfill 110 and the conductive areas 114 & 116, to protect the structures (110 & 114 & 116) underlying the etch stop layer 512 from damage caused by the etch process. The etch stop layer 512 terminates the etch process once the desired thickness of the ultrathin dielectric layer 508 has been achieved by the etch process.

The etch stop may be a silicon dioxide etch stop, a boron etch stop, an aluminum oxide etch stop, a polysilicon etch stop, a titanium oxide etch stop, or a silicon nitride etch stop.

The etch or lapping process may be a dry chemical etch process, a wet etch process, a gaseous etch process, for example, using oxide etch gases such as $CF_4$, $CHF_3$, $CH_2F_2$, $NF_3$, or $O_2$, or an electrochemical etch process, e.g., using electrochemical etch rate modulation. In an implementation, the ultrathin dielectric layer 508, or a component layer thereof, is formed by deposition, such as atomic layer deposition of a dielectric such as hafnium oxide ($HfO_2$).

A combination of an oxygen-plasma-grown metal oxide (e.g., aluminum oxide) and a high-quality alkylphosphonic acid self-assembled monolayer (SAM) can be obtained at process temperatures of no more than about 100° C., and can be formed not only on glass (silicon oxide) substrates, but also on commercially available flexible plastic substrates, such as polyethylene naphthalate or polyethylene terephthalate. Such an ultrathin dielectric layer 508 may have a total thickness of approximately 5-6 nanometers and a capacitance per unit area of approximately 500-800 $nF/cm^2$.

In a variation, after a smooth flat surface 504 has been obtained from etching the dielectric layer 502, an additional ultrathin dielectric layer 514, e.g., of silicon oxide or other high-k dielectric, may be formed above the smooth flat surface 504. The additional ultrathin dielectric layer 514 can be used to tune the thickness, and thus the capacitance, of the resulting capacitive interface 510, once the integrated circuit dies 102 & 102' have been coupled into a stack 506, forming the capacitive interface 510. The additional ultrathin dielectric layer 514 can also be used to increase the resistance of the capacitive interface 510 against charge and voltage leakage, or dielectric breakdown.

Figure 6:
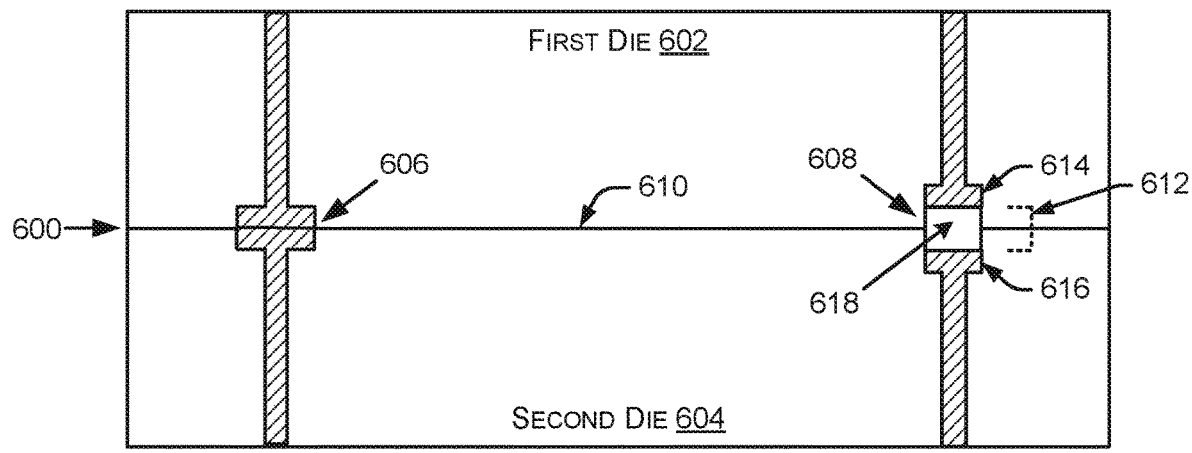
FIG. 6 is a diagram of an example direct-bonded interface between a first die and a second die that includes one or more direct-bonded conductive interconnects in the same bonding plane as one or more capacitive interconnects formed by the same direct bonding process.

FIG. 6 shows an example direct-bonded interface 600 between a first die 602 and a second die 604 that includes one or more direct-bonded conductive interconnects 606 in the same bonding plane 600 as one or more capacitive interconnects 608 formed by the same direct bonding process. The two surfaces being direct-bonded together to implement the direct-bonded interface 600 that has both conductive interconnects 606 and capacitive interconnects 608 may belong to two dies 602 & 604 in a die-to-die (D2D) process, may be a die 602 and a die-on-a-wafer 604 as in a die-to-wafer (D2W) process, or may be two dies-on-a-wafer 602 & 604 as in a wafer-to-wafer (W2W) process.

In a microfabrication process for making a device or package, the example first die 602 and example second die 604 are direct-bonded together at the bonding interface 600. A metal-to-metal direct bond is also formed by a direct-bonding process to make the conductive interconnect 606 between the first die 602 and the second die 604, formed at the bonding interface 600. The capacitive interconnect 608 between the first die 602 and the second die 604 is formed at the bonding interface 600 by the same direct-bonding process or processes.

In an implementation, the first die 602 and the second die 604 are direct-bonded together at the bonding interface 600 with a dielectric-to-dielectric direct bond 610 between respective nonmetal surfaces of the first die 602 and the second die 604.

The dielectric-to-dielectric direct bond 610 (e.g., oxide-to-oxide direct bond) between respective nonmetal surfaces of the first die 602 and the second die 604 also creates a capacitive coupling 612 of the capacitive interconnect 608. The capacitive coupling 612 of the capacitive interconnect 608 comprises a first metal 614 in the first die 602 and a second metal 616 in the second die 604. The first metal 614 and the second metal 616 are separated by a dielectric medium 618.

Figure 7:
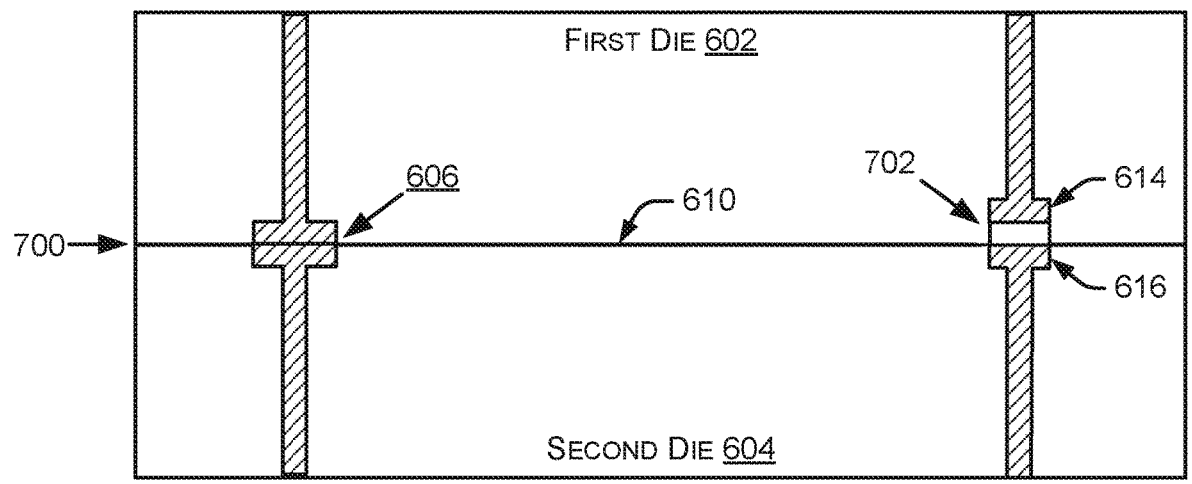
FIG. 7 is a diagram of another example direct-bonded interface between a first die and a second die that includes one or more direct-bonded conductive interconnects in the same bonding plane as one or more capacitive interconnects formed by the same direct bonding process.

FIG. 7 shows an example direct-bonded interface 700 between a first die 602 and a second die 604 that includes one or more direct-bonded conductive interconnects 606 in the same bonding plane 700 as one or more capacitive interconnects 702 formed by the same direct bonding process.

In an implementation, the first metal 614 of the capacitive interconnect 702 in the first die 602 is recessed from the bonding interface 700 by a space that has the dielectric medium 618, while the second metal 616 of the capacitive interconnect 702 in the second die 604 is flush with the bonding interface 700.

Figure 8:
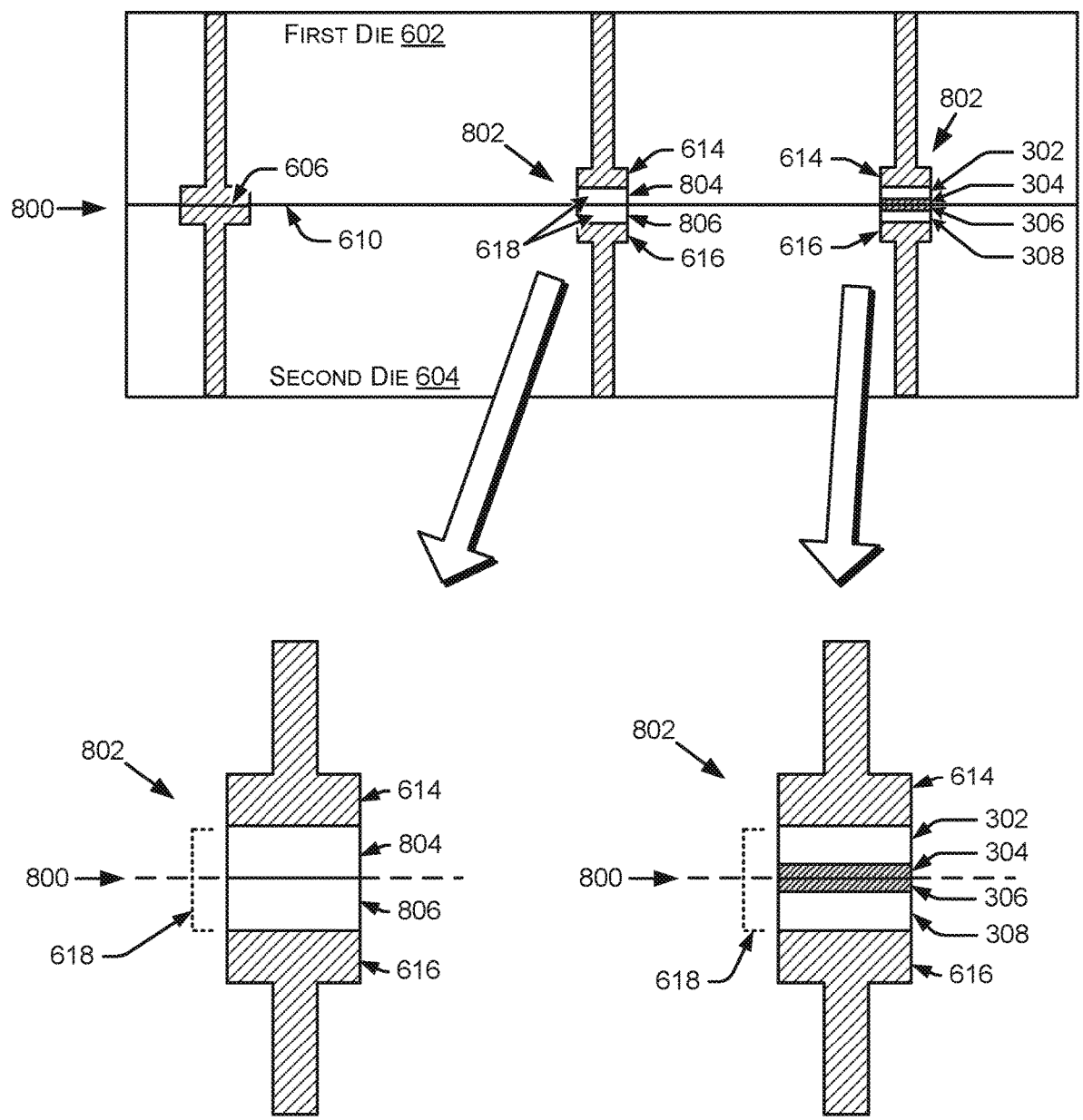
FIG. 8 is another diagram of an example direct-bonded interface between a first die and a second die that includes one or more direct-bonded conductive interconnects in the same bonding plane as one or more capacitive interconnects formed by the same direct bonding process.

FIG. 8 shows an example direct-bonded interface 800 between a first die 602 and a second die 604 that includes one or more direct-bonded conductive interconnects 606 in the same bonding plane 800 as one or more capacitive interconnects 802 formed by the same direct bonding process.

In an implementation, the first metal 614 of the capacitive interconnect 802 in the first die 602 is recessed from the bonding interface 800, while the second metal 616 of the capacitive interconnect 802 in the second die 604 is also recessed from the same bonding interface 800, in an opposing direction. One or more dielectric materials 804 & 806 can make up the dielectric medium 618 between metals 614 & 616 that creates the capacitive coupling (or capacitor) of the capacitive interconnect 802. The dielectric materials 804 & 806 shown in FIG. 8 are depicted as at least one solid dielectric material, while the dielectric material(s) shown in FIG. 6 are depicted as a gap (an air-filled gap, for example).

The dielectric medium 618 of the capacitive interconnect 802 can be made of silicon dioxide, silicon nitride, air, or a high dielectric material, for example, or mixtures or combinations of these and other dielectric materials, gases, and substances usable in semiconductor microfabrication.

The dielectric medium 618 of the capacitive interconnect 802 may be an asymmetrical combination of dielectric materials with respect to a horizontal plane of the bonding interface 800 between the first die 602 and the second die 604.

A spacing distance between the first metal 614 in the first die 602 and the second metal 616 in the second die 604 can be selected to provide a specific capacitance value or capacitance range for a given capacitive interconnect 802 or set of capacitive interconnects 802.

In an implementation, the dielectric medium 618 of the capacitive interconnect 608 or 702 or 802 may be at least one ultrathin layer of a dielectric material. The ultrathin layer of the dielectric material may be a coating, a film, a residue, a membrane, a deposit, or a gap (e.g., an air space).

A thickness and a dielectric constant of the ultrathin layer of the dielectric material can determine a capacitance or a capacitive utility of the capacitive interconnect 608 or 702 or 802. The ultrathin layer of the dielectric material may have a thickness less than or equal to approximately 50 nanometers, for example. The ultrathin layer of the dielectric material may also be made of multiple layers 302 & 304 & 306 & 308. In an implementation, a thickness of the combined multiple layers is less than 25 nanometers, for example. In an implementation, at least one of the multiple layers of the dielectric material may be a polymer layer 304 & 306. A capacitance of the capacitive interconnect 608 or 702 or 802 may be determined by a thickness of the one or more polymer layers 304 & 306.

Figure 9:
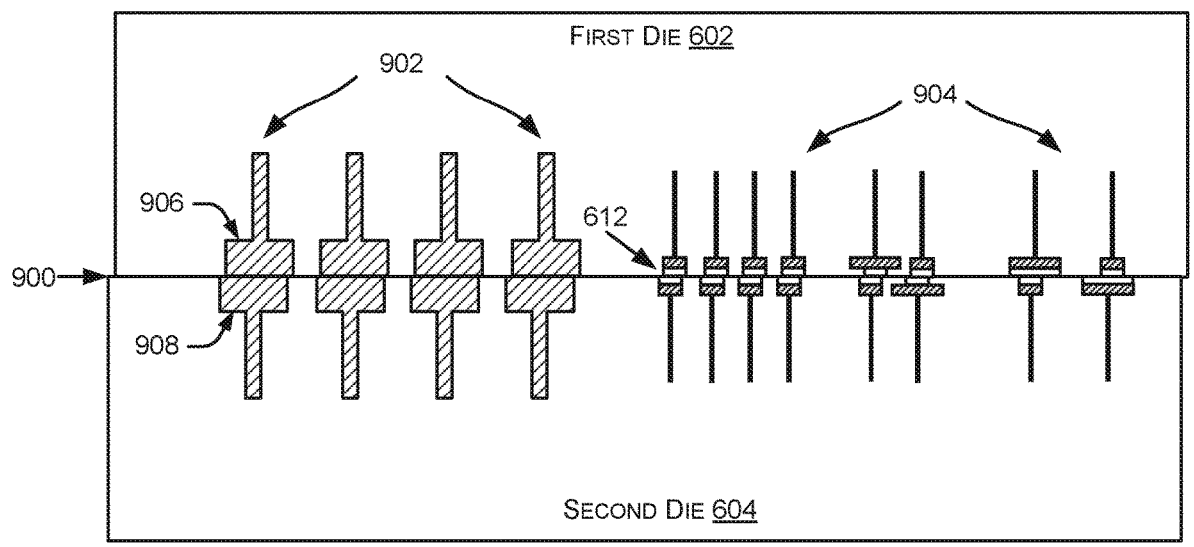
FIG. 9 is a diagram of an example direct-bonded interface that includes conductive interconnects direct-bonded together at the bonding interface, and example capacitive interconnects also coupled at the bonding interface.

FIG. 9 shows an example direct-bonded interface 900 that includes conductive interconnects 902 direct-bonded together at the bonding interface 900, and example capacitive interconnects 904 also coupled at the bonding interface 900. The conductive interconnects 902 may be direct-bonded power interconnects or direct-bonded ground interconnects, for example. The capacitive interconnects 904 may be signal lines between the first die 602 and the second die 604, for example. The bonding interface itself 900 is also direct-bonded together, with nonmetal-to-nonmetal direct bonds, for example. The joining of respective bonding surfaces of each die 602 & 604 into the direct-bonded interface 900 creates a capacitive coupling (612 in FIG. 6) for each individual capacitive interconnect 904, at the bonding interface 900.

One type of direct-bonding is direct hybrid bonding, which includes both direct-bonding of (nonmetal) dielectrics and direct-bonding of metal conductive interconnects 902 at same the bonding interface 900. Dielectric surfaces of the first die 602 and second die 604 on either side of the bonding interface 900 are direct-bonded together with oxide-to-oxide direct bonds, without any adhesives.

For the conductive interconnects 902, metal pads, such as pads 906 & 908, on either side of the bonding interface 900 are direct-bonded together with metal-to-metal contact bonds, with no solder or adhesives. In an implementation, "direct bond interconnect" (DBI® brand) direct hybrid bonding is utilized for the direct hybrid bonding process, which direct-bonds the dielectric surfaces of the two dies 602 & 604 together at room temperature, and then direct-bonds the metal pads 906 & 908 together at a higher annealing temperature (Invensas Inc., a subsidiary of Xperi Corp., San Jose, Calif.). DBI® direct hybrid bonding can provide 100,000-1,000,000 connections per sq. mm, with each connection averaging from <1 µm-40 µm in pitch. Even greater connection density is feasible with connections that are less than 1 µm in pitch.

In an implementation, the power and ground interconnects 902 may be redundant instances, so that if one or more pads 906 does not bond or does not align vertically, then power or ground connection is still made via other instances of the redundant conductive interconnects 902. The direct-bonded interconnects 902 may have relatively large metal pads, to provide a better bonding yield and to allow for some horizontal misalignment during the example direct hybrid bonding process, while ensuring that enough surface area of the metal pads 906 & 908 contact each other across the bonding interface 900 to conduct the desired electrical current flow.

The capacitive interconnects 904, for signal and data lines, do not bond in the direct hybrid bonding process, but instead form capacitive couplings 612 that make up the signal-passing interface of each capacitive interconnect 904 between dies 602 & 604.

In an implementation, signal lines using capacitive interconnects 904 may include redundant circuits for passing a signal across the bonding interface 900. The redundant circuits may provide a better yield during manufacture and/or provide high availability during use. Redundant signal lines may also be employed to achieve a certain overall capacitance for the capacitive coupling of a given signal circuit that crosses the joined electrical interface 602.

Figure 10:
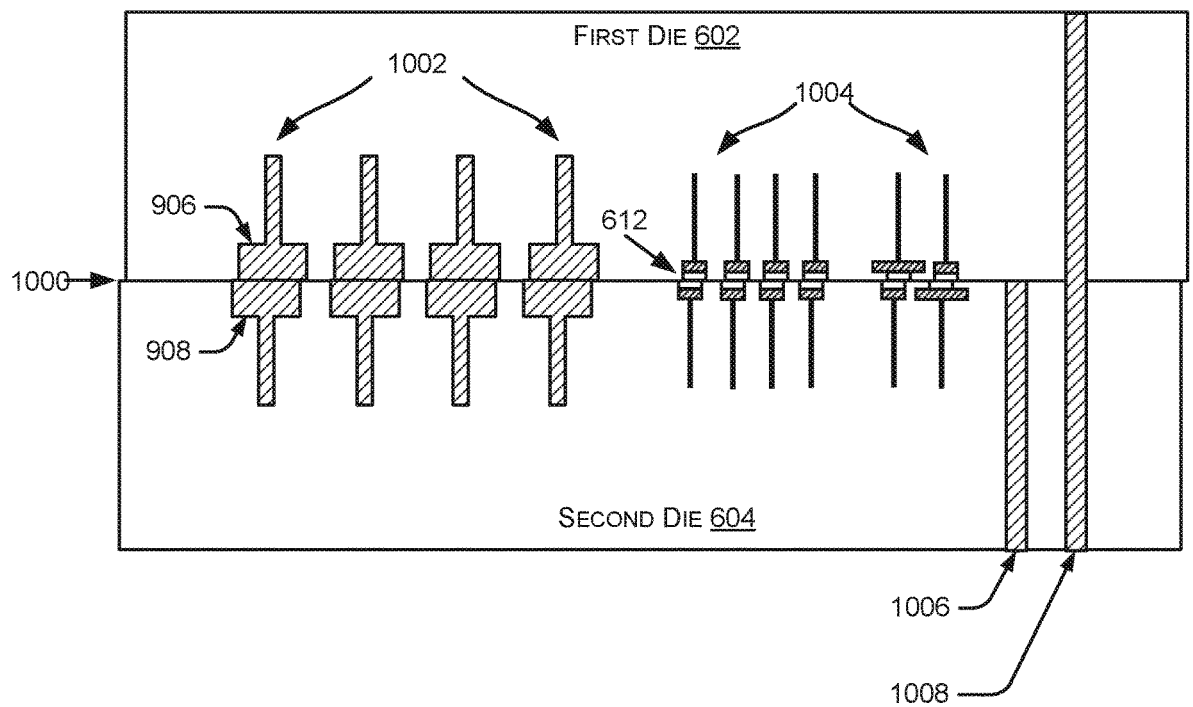
FIG. 10 is a diagram of an example direct-bonded interface that includes conductive interconnects direct-bonded together at the bonding interface and example capacitive interconnects also coupled at the same bonding interface, with one or more conductive through-vias at the same bonding interface.

FIG. 10 shows an example direct-bonded interface 1000 that includes conductive interconnects 1002 direct-bonded together at the bonding interface 1000, and example capacitive interconnects 1004 also coupled at the same bonding interface 1000. One or more conductive vias 1006 & 1008, such as through-silicon vias (TSVs) or through-dielectric-vias (TDVs) are also implemented in the example direct-bonded first and second dies 602 & 604.

A conductive through-via 1006 or 1008, may be fabricated in a via last process, for example. An example conductive through-via 1008 may be implemented to penetrate entirely or at least part way through one die 604. Or, an example through-via 1006 may be implemented to penetrate entirely or at least part way through both direct-bonded dies 602 & 604. Via last conductive through-vias 1006 & 1008 may provide advantages for process integration to reduce the processing impact and thermal budget on back end of line (BEOL) processing. The same back-to-front side wafer alignment that enables direct hybrid bonding, for example, can provide lithography alignment for via last patterning to integrate conductive through-vias 1006 & 1008.

Example Methods

Figure 11:
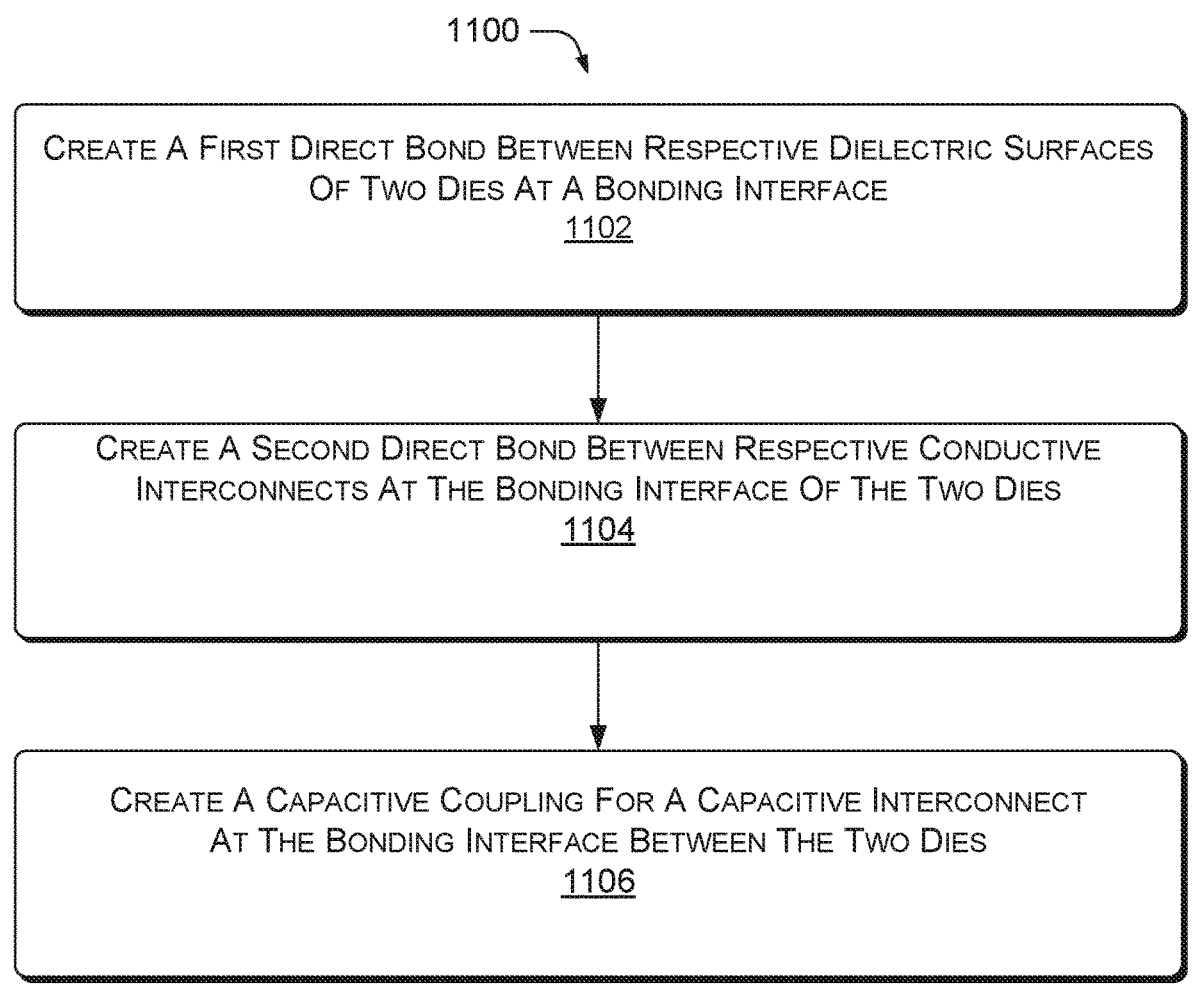
FIG. 11 is a flow diagram of an example method of creating a capacitive coupling in a direct-bonded interface for microelectronic devices.

FIG. 11 shows an example method 1100 of creating a capacitive coupling in a direct-bonded interface for microelectronic devices. In the flow diagram of FIG. 11, the operations of the example method 1100 are shown as individual blocks.

At block 1102, a first direct bond is created between respective dielectric surfaces of two dies at a bonding interface.

At block 1104, a second direct bond is created between respective conductive interconnects of the two dies at the bonding interface.

At block 1106, a capacitive coupling is created at the bonding interface for a capacitive interconnect between the two dies.

In general, the example method 1100 includes creating the first (nonmetal) direct bonds and the second (metal) direct bonds during the same direct bonding operation, which also forms the capacitive couplings in the same operation, all of these occurring at the same bonding interface during the same direct-bonding operation, such as a direct hybrid bonding operation.

The direct bond between the dielectric surfaces at the bonding interface comprises an oxide-to-oxide direct bond, for example. The direct bond between the respective conductive interconnects comprises a metal-to-metal direct bond. The capacitive coupling comprises at least one dielectric material at the bonding interface between two respective metals of the two dies, coupled by the same direct-bonding operation that accomplishes the oxide-to-oxide direct bond and the metal-to-metal direct bond.

In an implementation, an example method may include creating a bonding surface on a die, the bonding surface comprising a flat dielectric material for direct hybrid bonding, making a first metal pad of a power interconnect associated with the bonding surface, the first metal pad suitable for direct hybrid bonding, making a second metal pad of a ground interconnect associated with the bonding surface is made, the second metal pad suitable for direct hybrid bonding, making at least one recessed metal pad of a signal line associated with the bonding surface, the recessed pad for forming a capacitive coupling of the signal line across the bonding surface during direct hybrid bonding, and disposing a dielectric material suitable for making the capacitive coupling in a recess space between the recessed metal pad of the signal line and the bonding surface. At least one dielectric material suitable for making the capacitive coupling can be air, or can be silicon dioxide, silicon nitride, a high dielectric material, and so forth, as above.

The respective dielectric materials of first and second dies are direct-bonded together in an example direct hybrid bonding process to bond the first and second dies together and to form the capacitive coupling of the signal line between respective metal pads of the first and second dies.

Then the first and second dies are annealed in the example direct hybrid bonding operation to direct-bond the respective first metal pads to form the power interconnect and to direct-bond the respective second metal pads to form the ground interconnect.

While the present disclosure has been disclosed with respect to a limited number of embodiments, those skilled in the art, having the benefit of this disclosure, will appreciate numerous modifications and variations from the description provided herein. It is intended that the appended claims cover such modifications and variations as fall within the true spirit and scope of the disclosure.

The invention claimed is:

1. A microelectronic device comprising:
    a dielectric-to-dielectric direct bond between a first die and a second die, the first die and the second die being direct-bonded together at a bonding interface;
    a metal-to-metal direct bond at the bonding interface forming a conductive interconnect between the first die and the second die; and
    a capacitive interconnect between the first die and the second die formed at the bonding interface,
    wherein the capacitive interconnect comprises a first layer of a first dielectric medium on a first metal of the first die and a second layer of a second dielectric medium on a second metal of the second die,
    wherein a spacing distance between the first metal and the second metal is selected to provide a capacitance value for the capacitive interconnect;
    wherein the conductive interconnect comprises one of (i) a direct-bonded power interconnect or (ii) a direct-bonded ground interconnect, and
    wherein the capacitive interconnect comprises a signal line between the first die and the second die.

2. The microelectronic device of claim 1, wherein at least one (i) the first layer of the first dielectric medium and (ii) the second layer of the second dielectric medium is substantially flush with the bonding interface.

3. The microelectronic device of claim 1, further comprising a layer of dielectric material between the first layer and the second layer.

4. The microelectronic device of claim 3, wherein a combined thickness of the first layer, the second layer, and the layer of dielectric material is less than about 25 nanometers.

5. The microelectronic device of claim 1, wherein at least one (i) the first metal of the capacitive interconnect in the first die or (ii) the second metal of the capacitive interconnect in the second die is recessed from the bonding interface.

6. The microelectronic device of claim 1, wherein a spacing distance between the first metal in the first die and the second metal in the second die is selected to provide a capacitance value for the capacitive interconnect.

7. The microelectronic device of claim 1, wherein the capacitive interconnect includes at least one first conductive contact below the bonding interface of the first die and at least one second conductive contact below the bonding interface of the second die, the dielectric-to-dielectric direct bond between the first die and the second die extending between the at least one first conductive contact and the at least one second conductive contact.

8. The microelectronic device of claim 7, wherein the dielectric-to-dielectric direct bond between the first die and the second die extends between adjacent first conductive contacts and adjacent second conductive contacts.

9. A microelectronic device comprising:
a dielectric-to-dielectric direct bond between respective nonmetal surfaces of a first die and a second die, the first die and the second die being direct-bonded together at a bonding interface;
a metal-to-metal direct bond at the bonding interface forming a conductive interconnect between the first die and the second die; and
a capacitive interconnect between the first die and the second die formed at the bonding interface, the capacitive interconnect comprising a first layer of a first dielectric medium on a first metal of the first die and a second layer of a second dielectric medium on a second metal of the second die,
wherein a combined thickness of the first layer and the second layer is less than about 25 nanometers, and
wherein the capacitive interconnect comprises a signal line between the first die and the second die.

10. The microelectronic device of claim 9, wherein the conductive interconnect comprises one of (i) a direct-bonded power interconnect or (ii) a direct-bonded ground interconnect.

11. The microelectronic device of claim 9, wherein at least one (i) the first metal of the capacitive interconnect in the first die or (ii) the second metal of the capacitive interconnect in the second die is recessed from the bonding interface.

12. The microelectronic device of claim 9, wherein at least one (i) the first layer of the first dielectric medium and (ii) the second layer of the second dielectric medium is substantially flush with the bonding interface.

* * * * *